(12) United States Patent
Yamamoto

(10) Patent No.: US 8,003,231 B2
(45) Date of Patent: Aug. 23, 2011

(54) WEAR-RESISTANT MEMBER WITH HARD COATING

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 267 days.

(21) Appl. No.: 12/205,985

(22) Filed: Sep. 8, 2008

(65) Prior Publication Data

US 2009/0130460 A1 May 21, 2009

(30) Foreign Application Priority Data

Nov. 15, 2007 (JP) ................................ 2007-297176

(51) Int. Cl.
*B32B 9/00* (2006.01)
(52) U.S. Cl. ............ 428/697; 51/307; 51/309; 428/698; 428/699; 428/701; 428/702
(58) Field of Classification Search .................. 428/697, 428/698, 699, 701, 702; 51/307, 309
See application file for complete search history.

(56) References Cited

U.S. PATENT DOCUMENTS

| | | | | |
|---|---|---|---|---|
| 4,031,177 A | * | 6/1977 | Auriol et al. ..................... | 51/309 |
| 4,284,687 A | * | 8/1981 | Dreyer et al. ................. | 428/336 |
| 4,481,300 A | * | 11/1984 | Hartnett et al. .............. | 501/96.1 |
| 4,734,339 A | * | 3/1988 | Schachner et al. ............ | 428/698 |
| 5,310,607 A | | 5/1994 | Schulz et al. | |
| 5,336,280 A | * | 8/1994 | Dubots et al. ..................... | 51/307 |
| 5,924,904 A | * | 7/1999 | Fujii et al. ................. | 204/192.12 |
| 6,254,984 B1 | * | 7/2001 | Iyori ............................... | 428/699 |
| 6,451,180 B1 | | 9/2002 | Schiller et al. | |
| 6,617,057 B2 | * | 9/2003 | Gorokhovsky et al. ....... | 428/698 |
| 6,623,850 B2 | * | 9/2003 | Kukino et al. ................. | 428/699 |
| 7,169,485 B2 | * | 1/2007 | Kohara et al. ................. | 428/697 |
| 7,217,466 B2 | * | 5/2007 | Weber et al. ................. | 428/697 |
| 7,241,492 B2 | * | 7/2007 | Kohara et al. ................. | 428/698 |
| 7,294,416 B2 | * | 11/2007 | Yamamoto et al. ........... | 428/698 |
| 7,727,908 B2 | * | 6/2010 | Ahn et al. ..................... | 438/785 |
| 2006/0154108 A1 | * | 7/2006 | Fukui et al. .................... | 428/698 |
| 2008/0318062 A1 | * | 12/2008 | Endrino et al. ............... | 428/446 |

FOREIGN PATENT DOCUMENTS

| | | | |
|---|---|---|---|
| DE | 19818782 | * | 10/1999 |
| EP | 1422311 | * | 5/2004 |
| JP | 5-208326 | | 8/1993 |
| JP | 06-322517 | * | 11/1994 |
| JP | 07-328811 | * | 12/1995 |
| JP | 11-320214 | | 11/1999 |
| JP | 2002-160129 | * | 6/2002 |
| JP | 2002-544379 | | 12/2002 |
| JP | 2004-345006 | * | 12/2004 |
| JP | 2006-137982 | * | 6/2006 |

OTHER PUBLICATIONS

Willems et al "mechanical propertoes of gamma aluminium oxynitride" Journal of Materials Science 28 (1993) p. 6185-6189.*
Bandyopadhyay et al "Efeect of Reaction Parameters on gamma-AION formation from Al2O3 and AlN" J.Am. Ceram. Soc 85 (4) 2002 p. 1010-1012.*
Bandyopadhyay et al "Efeect of controlling parameters on the reaction sequence of formation of notrogen-containing magnesium aluminate spinel from MgO, Al2O3, and AlN" J.Am.Ceram. Soc. 87 (3) 2004 p. 480-482.*
Miller et al "Soluvility limit of MgO in Al2O3 at 1600 C".*
Office Action issued Oct. 25, 2010, in Korea Patent Application No. 10-2008-93153 (with English-language Translation).

* cited by examiner

*Primary Examiner* — Archene Turner
(74) *Attorney, Agent, or Firm* — Oblon, Spivak, McClelland, Maier & Neustadt, L.L.P.

(57) ABSTRACT

A member with alumina-based hard coating formed there-on wherein said hard coating contains nitrogen and has a composition represented by the formula (1) below:

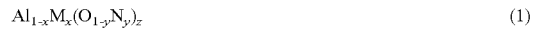

$$Al_{1-x}M_x(O_{1-y}N_y)_z \qquad (1)$$

$(0 \leq x \leq 0.5, 0 < y \leq 0.5, z > 0)$ where, M denotes at least one species of elements selected from those belonging to Group 4, Group 5, and Group 6 (excluding Cr), and such elements as Y, Mg, Si, and B.
The hard coating based on γ-alumina, which is formed at temperatures no higher than 1000° C., is superior in wear resistance and heat resistance.

20 Claims, 1 Drawing Sheet

WEAR-RESISTANT MEMBER WITH HARD COATING

BACKGROUND OF THE INVENTION

1. Field of the Invention

The present invention relates to a wear-resistant member with hard coating which will be used as cutting tools, sliding parts, molding dies, etc.

2. Description of the Related Art

Those members which are used as cutting tools (such as inserts, drills, and end mills), sliding parts, and molding dies usually have hard coating on their surface to meet their requirements for good wear resistance and sliding characteristics. In the past, such hard coating was formed mostly from an oxide, particularly aluminum oxide (or alumina $Al_2O_3$), by CVD (chemical vapor deposition). Unfortunately, CVD has a disadvantage of requiring a high treating temperature (exceeding 1000° C.) which causes heat deformation to the substrate; therefore, it cannot be applied to sharp-edged tools and rotating tools. In these application areas, CVD is being replaced by PVD (physical vapor deposition) which permits film formation at comparatively low treating temperatures.

Alumina has more than one crystalline structure. Typical among them is α-type (α-alumina) of rhombohedral system, which has a high melting point and remains stable. Other crystalline structures include γ-type (γ-alumina) of equiaxial system, which has high activity. γ-type is divided into δ-type and θ-type. α-alumina is formed at a higher annealing temperature (oxidizing temperature) above 1000° C. and γ-alumina is formed at a lower annealing temperature ranging from 400 to 700° C. Firing at much lower temperatures gives rise to amorphous aluminum oxide. In addition, γ-alumina transforms into α-alumina at temperatures above 1000° C.

Patent Document 1 discloses a method for forming α-alumina at a process temperature below 500° C. by PVD that employs a Cr-containing source. Patent Document 2 discloses a method for forming γ-alumina on the tool surface by pulsed sputtering.

Patent Document 1:
  Japanese Patent Laid-open No. Hei-5-208326
Patent Document 2:
  PCT translation No. 2002-544379

Unfortunately, the α-alumina formed at a low temperature from a Cr-containing source does not have a sufficiently high wear resistance. On the other hand, γ-alumina, which consists of smaller grains than α-alumina, has better wear resistance but is unstable in crystalline structure at high temperatures as mentioned above. This instability means that γ-alumina changes into α-alumina at high temperatures, resulting in volume shrinkage and cracking. The tip of a cutting tool encounters a large temperature change from ambient temperature to 1000° C. or above.

OBJECT AND SUMMARY OF THE INVENTION

The present invention was completed in view of the foregoing. It is an object of the present invention to provide a wear-resistant member with alumina-based coating superior in heat resistance which can be formed on the surface of a substrate alloy at a comparatively low temperature (below 1000° C.)

The first aspect of the present invention is directed to a member with alumina-based hard coating formed thereon wherein said hard coating contains nitrogen and has a composition represented by the formula (1) below:

$$Al_{1-x}M_x(O_{1-y}N_y)_z \quad (1)$$

$$(0 \leq X \leq 0.5, 0 < y \leq 0.5, z > 0)$$

where, M denotes at least one species of elements selected from those belonging to Group 4, Group 5, and Group 6 (excluding Cr), and such elements as Y, Mg, Si, and B.

The hard coating specified above offers the advantage of exhibiting remarkable wear resistance at high temperatures because it is based on γ-alumina. Its remarkable wear resistance is enhanced by its good heat resistance because γ-alumina is so stable as to undergo transition to the α-type crystalline structure only at a high temperature.

The second aspect of the present invention is directed to a member with alumina-based hard coating formed thereon wherein said hard coating has a composition represented by the formula (2) below:

$$Al_{1-x}M_x(O_{1-y}N_y)_z \quad (2)$$

$$(0 < x \leq 0.3, 0 \leq y \leq 0.5, z > 0)$$

where, M denotes at least one species of element selected from rare earth elements excluding Y.

The hard coating specified above offers the advantage of exhibiting remarkable wear resistance at high temperatures because it is based on γ-alumina. Its remarkable wear resistance is enhanced by its good heat resistance because γ-alumina is so stable as to undergo transition to the α-type crystalline structure only at a high temperature.

The third aspect of the present invention is directed to the member with alumina-based hard coating formed there-on as defined in the first or second aspect, wherein said hard coating is formed on a substrate whose temperature is 400° C. to 600° C.

The hard coating specified above offers the advantage of being formed at low temperatures, without the substrate undergoing heat deformation.

The fourth aspect of the present invention is directed to the member with alumina-based hard coating formed there-on as defined in the third aspect, wherein an underlying layer is interposed between said hard coating and said substrate, said underlying layer being a nitride which contains at least one of Al and Si and has an oxidation starting temperature higher than 800° C.

The underlying layer specified above improves adhesion between the substrate and the hard coating. It also protects itself from oxidation when the hard coating is formed.

[Effect of the Invention]

According to the present invention, the member with alumina-based hard coating formed thereon exhibits outstanding wear resistance and heat resistance (as per the first and second aspects), permits production at low temperatures below 1000° C. (as per the third aspect), and provides good adhesion between the hard coating and the substrate (as per the fourth aspect).

DESCRIPTION OF THE PREFERRED EMBODIMENTS

Figure 1:
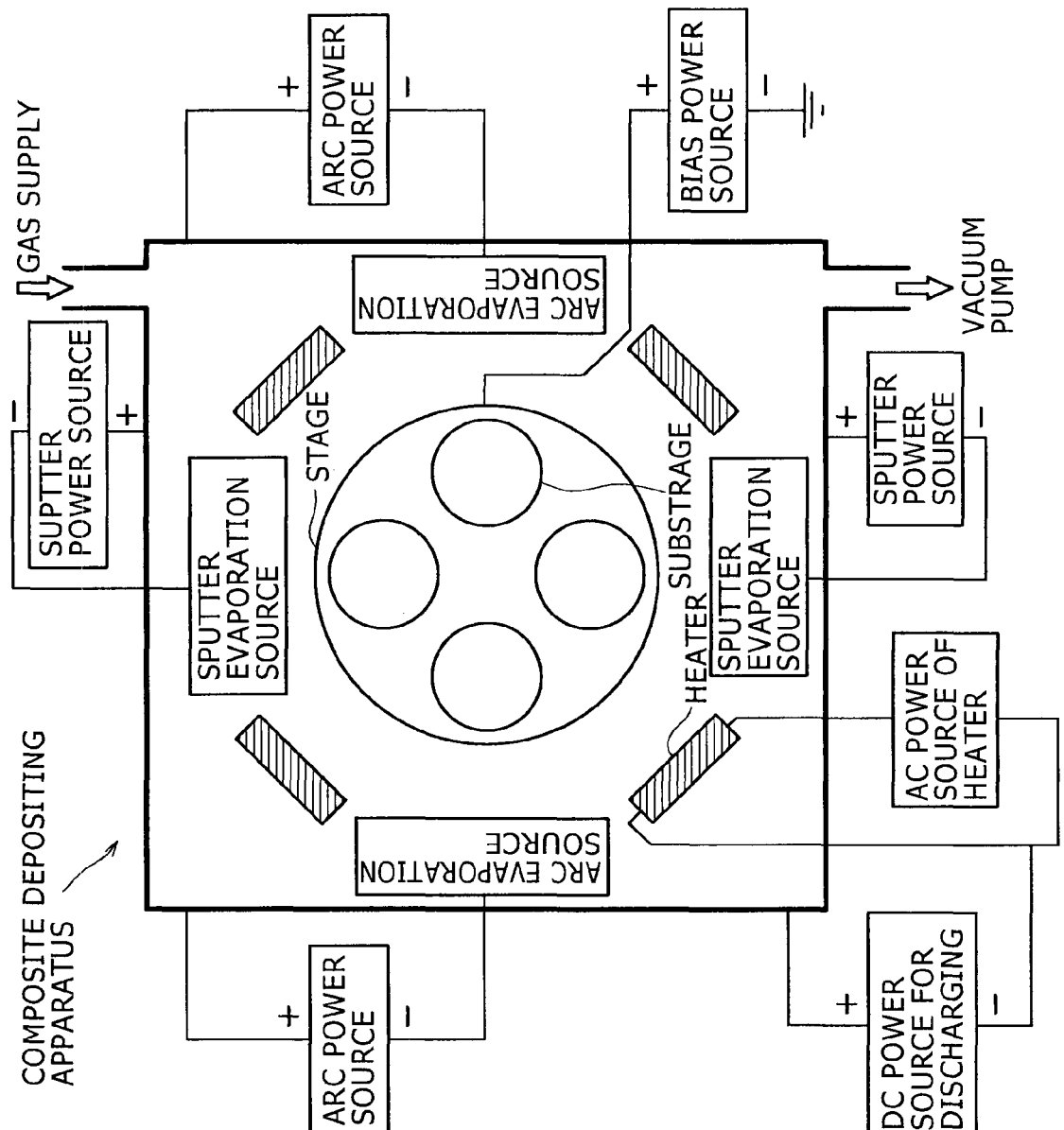
FIG. 1 is a schematic plan view showing a composite depositing apparatus.

The following deals with the member with alumina-based hard coating formed thereon which pertains to the present invention. The coated member finds use as cutting tools, sliding parts, molding dies, etc. The hard coating is based on γ-alumina. The substrate on which the hard coating is formed is any known materials such as cemented carbide, high speed steel, thermet, and sintered cubic boron nitride. The substrate is coated with said hard coating, with an underlying layer interposed between them. A recommendable material for the underlying layer is a nitride which has good adhesion to the substrate and good oxidation resistance and contains at least one of Al and Si.

As mentioned above, pure γ-alumina ($Al_2O_3$) is poor in stability at high temperatures and is liable to transition to α-type crystalline structure at 1000° C. and above. The hard coating according to the present invention retains the γ-type crystalline structure and hence remains hard at high temperatures owing to the specific elements incorporated in an adequate amount.

The following is a description of the specific elements and their amounts to be contained in the hard coating according to the present invention.

The hard coating pertaining to the first embodiment has a composition represented by the formula $$Al_{1-x}M_x(O_{1-y}N_y)_z \ (0 \leq x \leq 0.5, \ 0 < y \leq 0.5, \ z > 0).$$

It is based on γ-alumina and contains nitrogen in an amount equal to or less than that of oxygen. It also contains at least one species of metallic or semimetallic elements selected from those belonging to Group 4, Group 5, and Group 6 (excluding Cr), and Y, Mg, Si and B. The amount of such elements is equal to or less than that of aluminum. The value of z in the foregoing compositional formula represents the ratio of the total number of Al and M atoms to the total number of O and N atoms. It varies depending on the values of x and y and the valence of M.

N: $0 < y \leq 0.5$, where y is the ratio of the number of nitrogen atoms to the number of nitrogen atoms and oxygen atoms combined together.

Nitrogen is essential to stabilize alumina in its γ-type crystalline structure. For nitrogen to fully produce its effect, the ratio y should be no smaller than 0.1, preferably no smaller than 0.2, and no larger than 0.5, preferably no larger than 0.4. The latter requirement is imposed because the crystalline structure of alumina undergoes transition to that of nitride (AlN) when the number of nitrogen atoms exceeds the number of oxygen atoms. Thus, the ratio y is defined as $0 < y \leq 0.5$, preferably $0.1 \leq y \leq 0.4$, more preferably $0.2 \leq y \leq 0.4$.

M: $0 \leq x \leq 0.5$, where x is the ratio of the number of M atoms to the number of M atoms and aluminum atoms combined together. M is selected from elements belonging to Group 4, Group 5, and Group 6 (excluding Cr), and such elements as Y, Mg, Si, and B.

The hard coating according to the present invention contains a metallic or semimetallic element represented by M. M is at least one species of elements selected from those elements belonging to Group 4, Group 5, and Group 6 (excluding Cr), and such elements as Y, Mg, Si, and B. It stabilizes alumina in its γ-type crystalline structure, and it also makes the hard coating harder when it coexists with nitrogen. Although nitrogen-containing alumina (or aluminum oxynitride) in itself has a sufficiently stable γ-phase, incorporation with M is desirable to enhance stability and hardness. Preferred examples of M include Ti and Zr (both in Group 4), and Mg. On the other hand, V (in Group 5) and Mo and W (both in Group 6) are recommended for the hard coating to be used at mild temperatures because they form oxides with a low melting point.

For M to fully produce its effect, the ratio x should be no smaller than 0.05, preferably no smaller than 0.1, and no larger than 0.5, preferably no larger than 0.3. The latter requirement is imposed because M in excess of aluminum makes the hard coating contain a less amount of alumina and decrease in hardness. Thus, the ratio x for M (metallic or semimetallic element) is defined as $0 \leq x \leq 0.5$, preferably $0.05 \leq x \leq 0.3$, more preferably $0.1 \leq x \leq 0.3$. Where more than one species of M are involved, the ratio x is calculated from the total number of their atoms. In this case, their ratio is not specifically restricted.

The hard coating pertaining to the second embodiment has a composition represented by the compositional formula $$Al_{1-x}M_x(O_{1-y}N_y)_z \ (0 < x \leq 0.3, \ 0 \leq y \leq 0.5, \ z > 0).$$

It is based on γ-alumina and contains rare earth elements (excluding Y) in a specific amount relative to aluminum as shown in the compositional formula and also contains nitrogen in an amount equal to or less than that of oxygen. The difference between the first and second embodiments is replacement of Group 4 elements by rare earth elements. The effect of this replacement is an enhanced stability of γ-phase. The value of z in the foregoing compositional formula varies depending on the values of x and y and the valence of M as in the first embodiment.

M: $0 \leq x \leq 0.3$, where x is the ratio of the number of M atoms to the number of M atoms and aluminum atoms combined together. M denotes any of rare earth elements excluding Y.

The rare earth element is essential to stabilize alumina in its γ-type crystalline structure. It also makes the hard coating harder. Preferred examples of the rare earth elements include Nd, Ce, and La. For the rare earth element to fully produce its effect, the ratio x should be no smaller than 0.05, and no larger than 0.3, preferably no larger than 0.2. The latter requirement is imposed because the rare earth elements in an excess amount decreases the hardness of the hard coating. Thus, the ratio x is defined as $0 < x < 0.3$, preferably $0.05 \leq x \leq 0.2$. Where more than one species of M are involved, the ratio x is calculated from the total number of their atoms. In this case, their ratio is not specifically restricted.

N: $0 \leq y \leq 0.5$, where y is the ratio of the number of nitrogen atoms to the number of nitrogen atoms and oxygen atoms combined together.

Nitrogen stabilizes alumina in its γ-type crystalline structure, as mentioned above. Although nitrogen is not always necessary because alumina incorporated with rare earth elements (excluding Y) is stable in its γ-phase, it is desirable to add a certain amount of rare earth element for enhanced stability. Thus, the ratio y should be no smaller than 0.05, preferably no smaller than 0.1, and no larger than 0.5, preferably no larger than 0.4. The latter requirement is imposed because excess nitrogen causes the crystalline structure of alumina to transit into that of nitride. Thus, the hard coating pertaining to the second embodiment should have a composition in which the ratio y for nitrogen is defined as $0.05 \leq y \leq 0.4$, preferably $0.1 \leq y \leq 0.4$.

The first and second embodiments mentioned above may be modified such that the metallic or semimetallic element and the rare earth element are added in combination with each other. In this case, the ratio of the rare earth element (excluding Y) should be x as defined in the second embodiment. Also, the total amount of elements to be added should be adjusted so that the ratio (1-x) of aluminum is no smaller than 0.5, preferably no smaller than 0.7. The ratio of nitrogen should be y as defined in the second embodiment.

The hard coating according to the present invention is formed in the manner explained below.

Substrate Temperature for Coating: 400-600° C.

The hard coating according to the present invention may be formed by either CVD process or PVD process. However, the former process, which is carried out at high temperatures above 1000° C., is not desirable because of its possibility of causing deformation to the substrate. Therefore, PVD process to be performed at low temperatures is desirable. The preferred modes of PVD process include reactive sputtering, which employs an oxygen-containing atmosphere (such as Ar—$O_2$), and ion plating, which also employs an oxygen-containing atmosphere. The atmosphere may be incorporated with an adequate amount of nitrogen to make the hard coating contain nitrogen. The PVD process to form the hard coating should be carried out while the substrate is kept at 400° C. to 600° C. With the substrate temperature lower than 400° C., the resulting hard coating is amorphous, and the substrate heated above 1000° C. will deform. At such high temperatures, the hard coating will take on the α-type crystalline structure even though it has the composition specified in the present invention. The substrate temperature exceeds 600° C. when the temperature of the heater surface (which is the hottest part in the treating chamber) exceeds 800° C. In this situation, the underlying layer (mentioned later) is undesirably oxidized to form nitrogen.

Temperature at Which the Underlying Layer Starts to Oxidize: 800° C. or Above

The hard coating according to the present invention is chemically stable and hence hardly binds to the substrate. In other words, it does not firmly adhere to the surface of the substrate. Therefore, it is necessary to interpose an underlying layer between the substrate and the hard coating. A desirable underlying layer is that of nitride which firmly adheres to the surface of the substrate. The hard coating of oxide or oxynitride according to the present invention is formed by keeping the heater temperature at about 800° C. and the substrate temperature at 400-600° C. During this process, the nitride (which has been formed as the underlying coating on the substrate) is oxidized by oxygen introduced, as represented by the equation below.

$$MN + O_2 \rightarrow MO + N_2 \text{ (where M denotes a metallic or semimetallic element)}$$

This reaction gives off nitrogen gas, thereby making it difficult to control the partial pressure of nitrogen in the treating chamber. Moreover, this reaction partly oxidizes the underlying layer, thereby deteriorating its adhesion to the substrate. Consequently, the nitride to be formed as the underlying layer should have a sufficiently high temperature at which its oxidation starts and should not oxidize when the hard coating is formed. The underlying layer to meet this condition should be a nitride which contains at least one of Al and Si which starts to oxidize at 800° C. or above. Such a nitride should have a composition, with the fractions of Al and Si in the metallic or semimetallic elements being no less than 0.5 and no less than 0.03, respectively. Preferred compositions are represented by $(Ti_{0.5}Al_{0.5})N$, $(Ti_{0.1}Cr_{0.2}Al_{0.7})N$, $(Ti_{0.9}Si_{0.1})N$, and $(Ti_{0.2}Cr_{0.2}Al_{0.55}Si_{0.05})N$. These underlying layers may also be formed by reactive sputtering or ion plating like the hard coating.

EXAMPLES

The invention will be described in more detail with reference to the following Examples and Comparative Examples, which are not intended to restrict the scope thereof.

(Substrate)

Specimens in the examples are prepared by forming an underlying layer and a hard coating sequentially on the surface of a substrate selected for the purpose of evaluation. A substrate for evaluation of hardness and adhesion is mirror-finished cemented carbide. A substrate for evaluation of thermal stability is platinum. A substrate for evaluation of cutting is an insert of cemented carbide (SNGA10408).

Examples 1 to 31 and Comparative Examples 32 to 43

(Underlying Layer)
The surface of the substrate is coated by arc ion plating with an underlying layer (1 μm thick) of $(Ti_{0.5}Al_{0.5})N$, which starts to oxidize at 820° C.
(Hard Coating)
The underlying layer is coated with a hard coating (3 μm thick) of aluminum oxide containing various elements. Coating is accomplished by using a composite depositing apparatus (shown in FIG. 1) which is capable of both sputtering (SP) and arc ion plating (AIP) with Al-containing targets. The methods used for coating are shown in Table 1. The resultant hard coating is quantitatively analyzed by using an electron probe X-ray microanalysis (EPMA). The composition found by analyses is shown in Table 1.
(Deposition by Arc Ion Plating)
A substrate coated with an underlying layer is placed in the chamber of the depositing apparatus. The chamber is evacuated to $1 \times 10^{-3}$ Pa or below. The substrate is heated to about 600° C. (with the heater temperature being 800° C.). Sputter cleaning with Ar ions is performed. Deposition is performed in an atmosphere of pure oxygen at a total pressure of 2 Pa, with the target being 100 mm in diameter and the arc current being 150 A. For deposition of nitrogen-containing hard coating, the atmosphere is incorporated with nitrogen in such an amount that its partial pressure is 1/10 to 1/5 of that of oxygen. The substrate is given pulsed unipolar bias at a frequency of 30 kHz and a duty of 77%, with the voltage ranging from −50 to −100 V.
(Deposition by Sputtering)
The same procedure as used for deposition by arc ion plating is repeated as follows. A substrate coated with an underlying layer is placed in the chamber of the depositing apparatus. The chamber is evacuated to $1 \times 10^{-3}$ Pa or below. The substrate is heated to about 600° C. (with the heater temperature being 800° C.). Sputter cleaning with Ar ions is performed. Deposition is performed in an atmosphere of Ar—$O_2$ at a total pressure of 0.6 Pa, with the partial pressure of oxygen being 0.1-0.3 Pa. For deposition of nitrogen-containing hard coating, the atmosphere is incorporated with nitrogen in such an amount that its partial pressure is 1/10 to 1/5 of that of oxygen, as in the case of deposition by arc ion plating.

Examples 44 to 47 and Comparative Examples 48 and 49

(Underlying Layer)
The surface of the substrate is coated by arc ion plating with an underlying layer (1 μm thick) of nitride shown in Table 2.
(Hard Coating)
The underlying layer is coated with a hard coating (3 μm thick) of aluminum oxide containing Zr and N, represented by 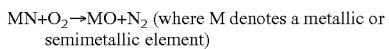. Coating is accomplished by using a composite depositing apparatus (shown in FIG. 1), which employs an Al-containing target. The atmosphere for deposition is incorporated with nitrogen at a partial pressure sufficient for the atomic ratio (y) for nitrogen to be 0.1. The resultant hard coating is quantitatively analyzed by EPMA. The composition thus found is shown in Table 2.

(Method for Evaluation)
(Measurement of Hardness)

Each specimen based on a mirror-finished substrate of cemented carbide is examined for Vickers hardness with a microvickers hardness meter under a load of 0.25 N. The acceptance criterion of hardness is HV2400 and above.

(Evaluation of Thermal Stability)

Each specimen based on a platinum substrate is tested for thermal stability by observing the crystalline structure of the hard coating before and after annealing at 1000° C. for 3 hours in a vacuum lower than $1 \times 10^{-3}$ Pa. The crystalline structure is examined by X-ray diffraction (Cu kα, scanned over θ-2θ). The presence of the γ-phase is confirmed by the peak due to the (400) plane near the diffraction angle of 45°. The formation of the α-phase is confirmed by the peak due to the (012) plane near the diffraction angle of 25°. The crystalline structure thus found is shown in Table 1. The specimen is regarded as acceptable if the γ-phase is present both before and after annealing.

(Evaluation of Wear Resistance)

Each specimen based on an insert of cemented carbide undergoes cutting test for evaluation of wear resistance. Wear resistance is rated in terms of crater depth in the cutting surface. Dry cutting without air blow is performed on FCD400 for 2 minutes at a cutting speed of 200 m/min, a cutting depth of 3 mm, and a feed rate of 0.2 mm/rev. The depth of crater wear due to cutting is shown in Tables 1 and 2. The specimen is regarded as acceptable if the depth of crater wear is less than 3 μm.

(Evaluation of Adhesion)

Each specimen based on a substrate of cemented carbide is examined for adhesion by scratch test under the following condition.

Diamond indenter: 200 μm R

Load increasing rate: 100 N/min

Scanning speed: 100 mm/min

The load required to peel the hard coating off the underlying layer is defined as the critical load. The critical load of each specimen is shown in Table 2. The specimen is regarded as acceptable if the critical load is larger than 80 N.

TABLE 1

| | | | Composition of oxide coating film (in atomic ratio) | | | | | Evaluation | | |
| | | | | M | | | | | Crystalline structure | |
| | Coating No. | method | Element | Atomic ratio | Al | O | N | Vickers hardness (HV) | Before heat treatment | After heat treatment | Crater wear depth (μm) |
|---|---|---|---|---|---|---|---|---|---|---|---|
| Example | 1 | SP | — | — | 1 | 0.97 | 0.03 | 2400 | g | g + a | 2.0 |
| | 2 | SP | — | — | 1 | 0.9 | 0.1 | 2500 | g | g | 1.5 |
| | 3 | SP | — | — | 1 | 0.8 | 0.2 | 2600 | g | g | 1.0 |
| | 4 | SP | — | — | 1 | 0.6 | 0.4 | 2650 | g | g | 0.5 |
| | 5 | SP | — | — | 1 | 0.5 | 0.5 | 2600 | g | g | 1.0 |
| | 6 | SP | Zr | 0.05 | 0.95 | 0.9 | 0.1 | 2500 | g | g | 1.5 |
| | 7 | SP | Zr | 0.1 | 0.9 | 0.9 | 0.1 | 2700 | g | g | 1.2 |
| | 8 | SP | Zr | 0.3 | 0.7 | 0.9 | 0.1 | 2800 | g | g | 1.0 |
| | 9 | SP | Zr | 0.5 | 0.5 | 0.9 | 0.1 | 2750 | g | g | 1.5 |
| | 10 | SP | Ti | 0.3 | 0.7 | 0.9 | 0.1 | 2800 | g | g | 1.2 |
| | 11 | SP | Nb | 0.3 | 0.7 | 0.9 | 0.1 | 2900 | g | g | 1.0 |
| | 12 | AIP | Mo | 0.2 | 0.8 | 0.9 | 0.1 | 2550 | g | g | 1.6 |
| | 13 | AIP | W | 0.1 | 0.9 | 0.9 | 0.1 | 2600 | g | g | 1.7 |
| | 14 | SP | Mg | 0.3 | 0.7 | 0.9 | 0.1 | 2750 | g | g | 1.0 |
| | 15 | SP | Y | 0.3 | 0.7 | 0.9 | 0.1 | 2700 | g | g | 1.2 |
| | 16 | SP | Si | 0.2 | 0.8 | 0.9 | 0.1 | 2850 | g | g | 1.1 |
| | 17 | SP | B | 0.1 | 0.9 | 0.95 | 0.05 | 2650 | g | g | 1.2 |
| | 18 | SP | B | 0.1 | 0.9 | 0.9 | 0.1 | 2700 | g | g | 1.3 |
| | 19 | AIP | Nd | 0.03 | 0.97 | 1 | 0 | 2500 | g | g + a | 2.0 |
| | 20 | AIP | Nd | 0.05 | 0.95 | 1 | 0 | 2600 | g | g | 1.5 |
| | 21 | AIP | Nd | 0.1 | 0.9 | 1 | 0 | 2650 | g | g | 1.0 |
| | 22 | AIP | Nd | 0.3 | 0.7 | 1 | 0 | 2700 | g | g | 0.8 |
| | 23 | AIP | La | 0.1 | 0.9 | 1 | 0 | 2650 | g | g | 1.0 |
| | 24 | AIP | Ce | 0.1 | 0.9 | 1 | 0 | 2750 | g | g | 0.7 |
| | 25 | AIP | Ce | 0.1 | 0.9 | 0.95 | 0.05 | 2800 | g | g | 0.65 |
| | 26 | AIP | Ce | 0.1 | 0.9 | 0.9 | 0.1 | 2900 | g | g | 0.6 |
| | 27 | AIP | Ce | 0.1 | 0.9 | 0.7 | 0.3 | 2900 | g | g | 0.5 |
| | 28 | AIP | Ce | 0.1 | 0.9 | 0.5 | 0.5 | 2700 | g | g | 0.6 |
| | 29 | SP | Ti Ce | 0.1 0.1 | 0.8 | 1 | 0 | 2900 | g | g | 0.4 |
| | 30 | SP | Zr Nd | 0.1 0.1 | 0.8 | 0.9 | 0.1 | 2950 | g | g | 0.3 |
| | 31 | SP | Ti Y | 0.1 0.1 | 0.8 | 0.8 | 0.2 | 2850 | g | g | 0.45 |
| Comparative Example | 32 | SP | — | — | 1 | 1 | 0 | 2300 | g | a | >3 |
| | 33 | AIP | — | — | 1 | 1 | 0 | 2300 | g | a | >3 |
| | 34 | SP | — | — | 1 | 0.4 | 0.6 | 2200 | Amorphous | Amorphous | >3 |
| | 35 | SP | Si | 0.2 | 0.8 | 1 | 0 | 2400 | g | g | >3 |
| | 36 | SP | Nb | 0.3 | 0.7 | 1 | 0 | 2370 | g | g | >3 |
| | 37 | SP | Ti | 0.3 | 0.7 | 1 | 0 | 2350 | g | g | >3 |
| | 38 | SP | Zr | 0.5 | 0.5 | 1 | 0 | 2300 | g | g | >3 |

TABLE 1-continued

| | | Composition of oxide coating film (in atomic ratio) | | | | | | Evaluation | | |
| | | | | | | | | Crystalline structure | | |
| No. | Coating method | Element | M Atomic ratio | Al | O | N | Vickers hardness (HV) | Before heat treatment | After heat treatment | Crater wear depth (μm) |
| --- | --- | --- | --- | --- | --- | --- | --- | --- | --- | --- |
| 39 | SP | Zr | 0.6 | 0.4 | 0.9 | 0.1 | 2300 | g | g | >3 |
| 40 | AIP | Ce | 0.1 | 0.9 | 0.4 | 0.6 | 2300 | Amorphous | Amorphous | >3 |
| 41 | AIP | Nd | 0.35 | 0.65 | 1 | 0 | 2380 | g | g | >3 |
| 42 | AIP | Nd | 0.5 | 0.5 | 1 | 0 | 2350 | g | g | >3 |
| 43 | AIP | Nd | 0.6 | 0.4 | 1 | 0 | 2300 | Amorphous | Amorphous | >3 |

TABLE 2

| | No. | Underlying layer | | Composition of oxide hard coating (in atomic ratio) | | | | | Evaluation | |
| | | Composition | Oxidation starting temperature (°C.) | Al | Zr | O | N | N (aimed) | Critical load (N) | Crater wear depth (μm) |
| --- | --- | --- | --- | --- | --- | --- | --- | --- | --- | --- |
| Example | 44 | $Ti_{0.5}Al_{0.5}N$ | 820 | 0.9 | 0.1 | 0.8 | 0.2 | 0.1 | 80 | 1.5 |
| | 45 | $Ti_{0.1}Cr_{0.2}Al_{0.7}N$ | 1000 | 0.9 | 0.1 | 0.9 | 0.1 | 0.1 | 90 | 1 |
| | 46 | $Ti_{0.2}Cr_{0.2}Al_{0.55}Si_{0.05}N$ | 1100 | 0.9 | 0.1 | 0.9 | 0.1 | 0.1 | 100 | 1 |
| | 47 | $Al_{0.7}Cr_{0.3}N$ | 950 | 0.9 | 0.1 | 0.9 | 0.1 | 0.1 | 100 | 1.2 |
| Comparative Example | 48 | TiN | 600 | 0.9 | 0.1 | 0.4 | 0.6 | 0.1 | 50 | >3 |
| | 49 | CrN | 700 | 0.9 | 0.1 | 0.45 | 0.55 | 0.1 | 60 | >3 |

The specimen of Example 1, with a low nitrogen content as indicated by an atomic ratio of 0.03, is slightly inferior in thermal stability, which causes the partial transition into α-crystalline structure to occur after annealing. The specimens of Examples 2 to 5, with a sufficient nitrogen content, are satisfactory in thermal stability, hardness, and wear resistance. The specimens of Examples 6 to 18, with nitrogen and any of elements of Groups 4 to 6 and Y, Mg, Si, and B, are also superior in thermal stability, hardness, and wear resistance. The specimens of Examples 7, 8, 10, 11, 14, 15, 16, and 18, which contain additional elements in an adequate amount, are by far superior in hardness and wear resistance to the specimen of Example 2 which contains only nitrogen in the same amount.

The specimen of Example 19, with a low content of Nd (rare earth element) as indicated by an atomic ratio of 0.03, is slightly inferior in thermal stability, which causes the partial transition into α-crystalline structure to occur after annealing. The specimens of Examples 20 to 24, with a sufficient content of Nd, Ce, and La, are satisfactory in thermal stability, hardness, and wear resistance, as in the case of the specimens of Examples 2 to 5 which contain nitrogen. The specimens of Examples 25 to 28, which contain nitrogen and Ce (rare earth element), are by far superior in hardness and wear resistance to the specimen of Example 24, which contains Ce in the same amount.

The specimens of Examples 29 to 31, which contain two kinds of metals, are superior in thermal stability, hardness, and wear resistance. Particularly, the specimen of Example 29, which contains both an element of Group 4 and a rare earth metal (excluding Y), and the specimen of Example 30, which further contains nitrogen, are by far superior in hardness and wear resistance.

By contrast, the specimens of Comparative Examples 32 and 33, which are composed of pure aluminum oxide ($Al_2O_3$) free of additives such as nitrogen and rare earth element, are inferior in thermal stability as evidenced by transition into the α-crystalline structure that occurs during heat treatment at 1000° C. The specimen of Comparative Example 35, which contains only Si (not nitrogen) is poor in wear resistance. The specimens of Comparative Examples 36 to 38, which contain only elements of Groups 4 and 5 (not nitrogen) are poor in hardness and wear resistance. On the other hand, the specimens of Comparative Examples 34 and 40, which contain more nitrogen than oxygen (in terms of the number of atoms), form nitrides without crystallization and hence they are poor in hardness and wear resistance. The specimen of Comparative Example 39, which contains more Zr (an element of Group 4) than Al, is poor in hardness and wear resistance due to a lower amount of alumina. The specimens of Comparative Examples 41 and 42, which contain excess Nd (rare earth element), are poor in hardness and wear resistance. The specimen of Comparative Example 43, which contains more Nd (rare earth element) than Al, does not achieve crystallization.

The specimen of Example 44 contains slightly more nitrogen than necessary because the oxidation starting temperature of the underlying layer is close to the temperature at which the hard coating is formed and the underlying layer is partly oxidized when the hard coating is formed. The specimens of Examples 45 to 47 contain as much nitrogen as intended because the oxidation starting temperature of the underlying layer is sufficiently high compared with the temperature at which the hard coating is formed. By contrast, the specimens of Comparative Examples and 49 result in the underlying layer oxidizing when the hard coating is formed because the underlying layer is a nitride which has a low oxidation starting temperature. Oxidation of the underlying layer causes nitrogen to release itself in the treating chamber. As the result, the hard coating contains more nitrogen than intended (exceeding the range specified in the present inven-

What is claimed is:

1. A member with alumina-based hard coating formed thereon wherein said hard coating contains nitrogen and has a composition represented by the formula (1) below:

$$Al_{1-x}M_x(O_{1-y}N_y)_z \qquad (1)$$

$(0 \leq x \leq 0.5, 0 < y \leq 0.5, z > 0)$ where, M denotes at least one species of elements selected from those belonging to Group 4, Group 5, and Group 6 (excluding Cr), Y, Mg, Si, and B
wherein said hard coating has a γ-type crystalline structure
wherein said member is at least one member selected from the group consisting of a cutting tool, a sliding member and a forming die.

2. The member with alumina-based hard coating formed thereon as defined in claim 1, wherein said hard coating is formed when its substrate is at a temperature of 400-600° C.

3. The member with alumina-based hard coating formed thereon as defined in claim 1, wherein M is at least one species of elements selected from the group consisting of Ti, Zr, Hf, Th, V, Nb, Ta, Pa, Nd, Mo, W, U, Y, Mg, Si and B.

4. The member with alumina-based hard coating formed thereon as defined in claim 1, wherein M is at least one species of elements selected from the group consisting of Ti, Zr, Nb, Mo, W, Y, Mg, Si and B.

5. The member with alumina-based hard coating formed thereon as defined in claim 1, wherein M is at least one species of elements selected from the group consisting of Ti, Zr, Mg, V, Mo and W.

6. The member with alumina-based hard coating formed thereon as defined in claim 1, where $0.1 \leq y \leq 0.5$.

7. The member with alumina-based hard coating formed thereon as defined in claim 1, where $0.2 \leq y \leq 0.4$.

8. The member with alumina-based hard coating formed thereon as defined in claim 1, wherein M is at least one species of elements selected from the group consisting of Zr, Hf, Th, V, Nb, Ta, Pa, Nd, Mo, W, U, Y, Mg, Si and B.

9. The member with alumina-based hard coating formed thereon as defined in claim 1, wherein M is at least one species of elements selected from the group consisting of Ti, Hf, Th, V, Nb, Ta, Pa, Nd, Mo, W, U, Y, Mg, Si and B.

10. A member with alumina-based hard coating formed thereon wherein said hard coating contains nitrogen and has a composition represented by the formula (1) below:

$$Al_{1-x}M_x(O_{1-y}N_y)_z \qquad (1)$$

$(0 \leq x \leq 0.5, 0 < y \leq 0.5, z > 0)$ where, M denotes at least one species of elements selected from those belonging to Group 4, Group 5, and Group 6 (excluding Cr), Y, Mg, Si, and B
wherein said hard coating has a γ-type crystalline structure
wherein said hard coating is formed when its substrate is at a temperature of 400-600° C.
which further has an underlying layer interposed between said substrate and said hard coating and said underlying layer is a nitride which contains at least one species of Al and Si and has an oxidation starting temperature of 800° C. or above.

11. A member with alumina-based hard coating formed thereon wherein said hard coating has a composition represented by the formula (2) below:

$$Al_{1-x}M_x(O_{1-y}N_y)_z \qquad (2)$$

$(0 < x \leq 0.3, 0.05 \leq y \leq 0.4, z > 0)$ where, M denotes at least one species of element selected from rare earth elements excluding Y
wherein said hard coating has a γ-type crystalline structure.

12. The member with alumina-based hard coating formed thereon as defined in claim 11, wherein said hard coating is formed when its substrate is at a temperature of 400-600° C.

13. The member with alumina-based hard coating formed thereon as defined in claim 12, which further has an underlying layer interposed between said substrate and said hard coating and said underlying layer is a nitride which contains at least one species of Al and Si and has an oxidation starting temperature of 800° C. or above.

14. The member with alumina-based hard coating formed thereon as defined in claim 11, wherein M is at least one species of elements selected from the group consisting of Sc, La, Ce, Pr, Nd, Pm, Sm, Eu, Gd, Tb, Dy, Ho, Er, Tm, Yb and Lu.

15. The member with alumina-based hard coating formed thereon as defined in claim 11, wherein M is at least one species of elements selected from the group consisting of La, Ce and Nd.

16. The member with alumina-based hard coating formed thereon as defined in claim 11, where $0.05 \leq x \leq 0.2$.

17. The member with alumina-based hard coating formed thereon as defined in claim 11, where $0.1 \leq y \leq 0.4$.

18. A member with alumina-based hard coating formed thereon wherein said hard coating contains nitrogen and has a composition represented by the formula (1) below:

$$Al_{1-x}M_x(O_{1-y}N_y)_z \qquad (1)$$

$(0.05 \leq x \leq 0.3, 0 < y \leq 0.5, z > 0)$ where, M denotes at least one species of elements selected from those belonging to Group 4, Group 5, and Group 6 (excluding Cr), Y, Mg, Si, and B
wherein said hard coating has a γ-type crystalline structure.

19. The member with alumina-based hard coating formed thereon as defined in claim 18, where $0.1 \leq x \leq 0.3$.

20. A member with alumina-based hard coating formed thereon wherein said hard coating contains nitrogen and has a composition represented by the formula (1) below:

$$Al_{1-x}M_x(O_{1-y}N_y)_z \qquad (1)$$

$(0 \leq x \leq 0.5, 0 < y \leq 0.4, z > 0)$ where, M denotes at least one species of elements selected from the group consisting of Hf, Th, V, Nb, Ta, Pa, Nd, Mo, W, U, Y, Mg, Si and B
wherein said hard coating has a γ-type crystalline structure and
wherein said member is at least one member selected from the group consisting of a cutting tool, a sliding member and a forming die.

* * * * *